US006687864B1

(12) United States Patent
Nayak et al.

(10) Patent No.: US 6,687,864 B1
(45) Date of Patent: Feb. 3, 2004

(54) MACRO-CELL FLIP-FLOP WITH SCAN-IN INPUT

(75) Inventors: Anup Nayak, Fremont, CA (US); Ramin Ighani, Santa Clara, CA (US); Sanjeev Kumar Maheshwari, Taitaran (IN)

(73) Assignee: Cypress Semiconductor Corp., San Jose, CA (US)

( * ) Notice: Subject to any disclaimer, the term of this patent is extended or adjusted under 35 U.S.C. 154(b) by 462 days.

(21) Appl. No.: 09/589,840

(22) Filed: Jun. 8, 2000

(51) Int. Cl.$^7$ .............................................. G01R 21/28
(52) U.S. Cl. ....................................... 714/725; 714/727
(58) Field of Search ................................... 714/725, 727

(56) References Cited

U.S. PATENT DOCUMENTS

| | | | |
|---|---|---|---|
| 4,933,736 A | 6/1990 | Conner et al. ................. 357/50 |
| 5,028,814 A | 7/1991 | Sung et al. ............... 307/272.2 |
| 5,087,837 A | 2/1992 | Cline .......................... 307/455 |
| 5,218,245 A * | 6/1993 | Kohler et al. .................. 326/46 |
| 5,347,519 A * | 9/1994 | Cooke et al. ................ 714/725 |
| 5,550,843 A * | 8/1996 | Yee .............................. 714/726 |
| 5,651,013 A * | 7/1997 | Iadanza ....................... 714/731 |
| 5,714,890 A | 2/1998 | Cline .......................... 326/40 |
| 5,789,945 A | 8/1998 | Cline .......................... 326/94 |
| 5,805,607 A * | 9/1998 | Khu ............................ 714/726 |
| 5,867,507 A * | 2/1999 | Beebe et al. ................. 714/726 |
| 6,157,210 A * | 12/2000 | Zaveri et al. .................. 326/40 |
| 6,304,099 B1 * | 10/2001 | Tang et al. .................... 326/38 |
| 6,314,539 B1 * | 11/2001 | Jacobson et al. ........... 714/727 |
| 6,484,280 B1 * | 11/2002 | Moberly ...................... 714/726 |

* cited by examiner

Primary Examiner—Albert Decady
Assistant Examiner—Joseph D. Torres
(74) Attorney, Agent, or Firm—Christopher P. Maiorana, P.C.

(57) ABSTRACT

A programmable logic device comprising a macro-cell flip-flop configured to store (i) a first input when the programmable logic device is in a normal mode and (ii) a second input when the programmable logic device is in a test mode.

23 Claims, 5 Drawing Sheets

US 6,687,864 B1

MACRO-CELL FLIP-FLOP WITH SCAN-IN INPUT

FIELD OF THE INVENTION

The present invention relates to a method and/or architecture for macro-cell flip-flops generally and, more particularly, to a method and/or architecture for a macro-cell flip-flop with a scan-in input.

BACKGROUND OF THE INVENTION

A programmable logic device (PLD) provides an economical and efficient means for implementing predetermined Boolean logic functions in an integrated circuit. Such a device consists of, generally, an AND plane configured to generate predetermined product terms in response to a plurality of inputs, a group of fixed/programmable OR gates configured to generate a plurality of sum-of-products(SOP) terms in response to the product terms, and a number of logic elements (i.e., macro-cells) configured to generate a desired output in response to the sum-of-products terms. The output of the macro-cells may be presented at an I/O pin or routed back to the AND plane. The sum-of-products terms can also be generated using programmable NOR-NOR or NAND-NAND logic.

Each macro-cell can contain a flip-flop called a macro-cell flip-flop. Testing the functionality of the macro-cell and surrounding logic is required. Scan test procedures are conducted to test the macro-cells and surrounding logic without increasing the device pin count. One such scan test procedure is an IEEE std 1149.1 JTAG (referred to herein as JTAG) boundary scan test. A JTAG boundary scan test is conducted with JTAG test instrumentation connected to I/O pins of the PLD.

Referring to FIG. 1, a block diagram of a conventional PLD 10 is shown. The PLD 10 has a number of macro-cells 12a–12n. Each of the macro-cells 12a–12n may be associated with an I/O pin 14a–14n. Each macro-cell has three boundary scan registers 16a–16n and an associated macro-cell flip-flop 18a–18n. Test data is shifted in and out of the flip-flops 18a–18n of each macro-cell 12a–12n using the scan registers 16a–16n. The conventional method of testing a PLD requires either a direct connection of the macro-cells 12a–12n to I/O pins 14a–14n and/or additional boundary scan registers 16a–16n. Since three boundary scan registers 16a–16n are used for each macro-cell flip-flop 18a–18n, three clock cycles are required for each test data bit to be shifted through each macro-cell 12a–12n.

Modern PLDs continue to increase in complexity. The increasing complexity causes increased difficulty in providing direct access to the content of each macro-cell from a dedicated I/O pin. For example, a modern PLD can have, in one example, over 1500 macro-cells but less than 500 I/O pins. A solution that provides a scan chain made up of all the macro-cells of a PLD with a minimum number of I/O pins would be desirable. A solution that can use the available flip-flop resource of a macro-cell, without requiring additional boundary scan registers would also be desirable.

SUMMARY OF THE INVENTION

The present invention concerns a programmable logic device comprising a macro-cell flip-flop configured to store (i) a first input when the programmable logic device is in a normal mode and (ii) a second input when the programmable logic device is in a test mode.

The objects, features and advantages of the present invention include providing a method and/or architecture for a macro-cell flip-flop with a scan-in input that may (i) provide an easily accessible internal scan test interface, (ii) improve testability of the macro-cells and surrounding logic inside a PLD, (iii) eliminate the requirement for a one-to-one correspondence between I/O pins and macro-cells, (iv) be configured as a part of regular logic or a test scan chain, (v) easily form a test scan chain, containing all the macro-cells of a PLD, (vi) not require additional registers for a scan operation, and/or (vii) be asynchronously reset or preset.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
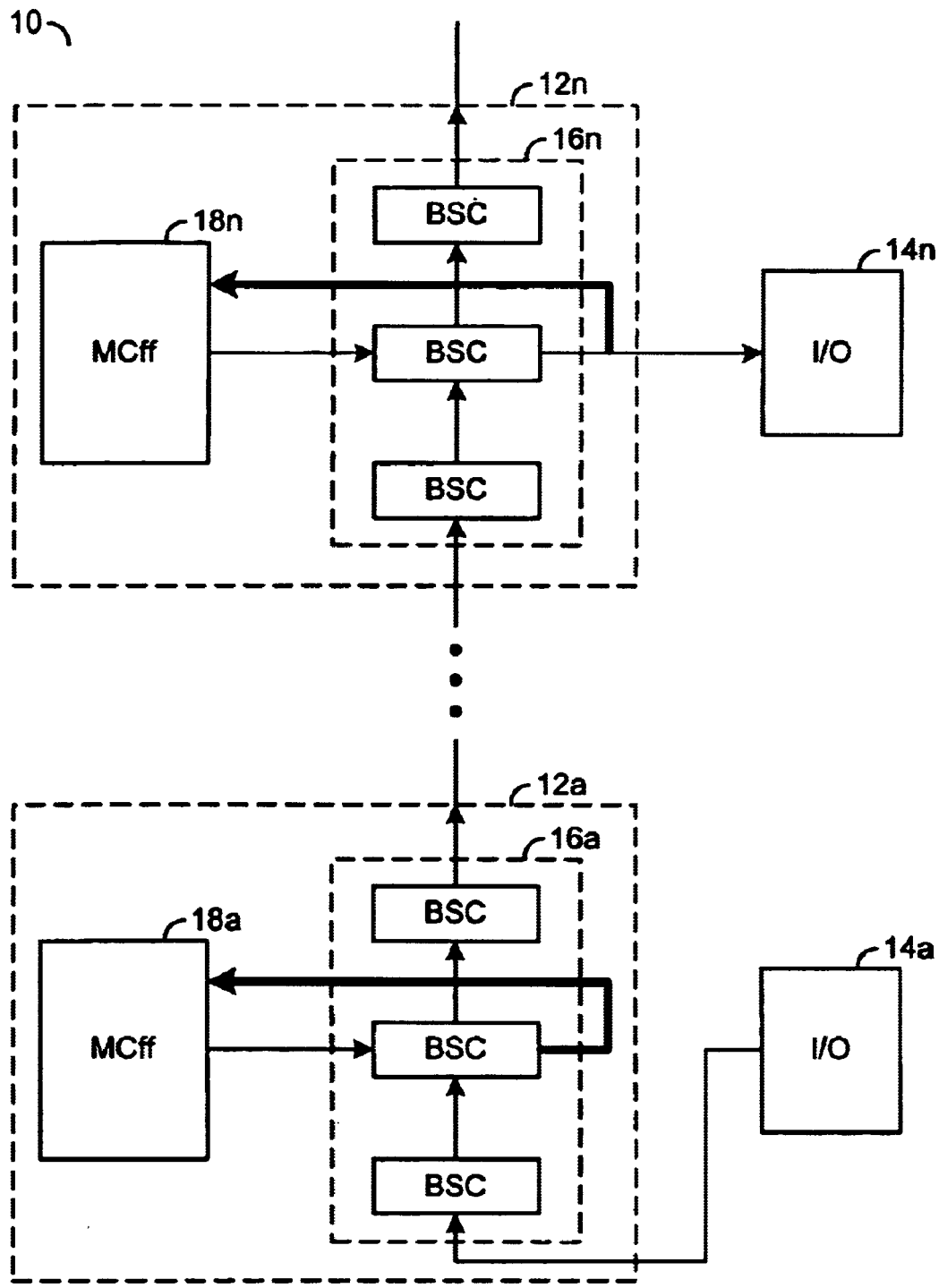
FIG. 1 is a block diagram illustrating a macro-cell scan chain implementation in a conventional programmable logic device.
Figure 2:
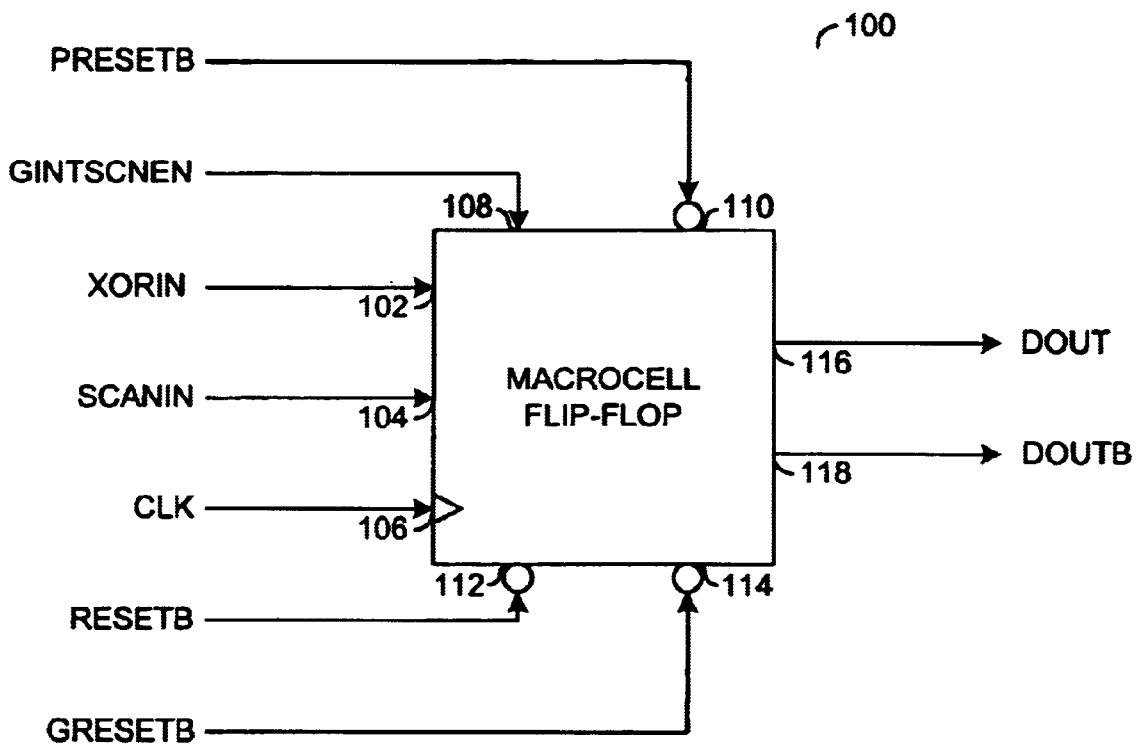
FIG. 2 is a block diagram illustrating a preferred embodiment of the present invention.

Referring to FIG. 2, a block diagram of a circuit 100 is shown in accordance with a preferred embodiment of the present invention. The circuit 100 may be implemented, in one example, as a macro-cell flip-flop of a programmable logic device (PLD). The circuit 100 may have, in one example, an input 102 that may receive a signal (e.g., XORIN), an input 104 that may receive a signal (e.g., SCANIN), an input 106 that may receive a signal (e.g., CLK), an input 108 that may receive a signal (e.g., GINTSCNEN), an input 110 that may receive a signal (e.g., PRESETB), an input 112 that may receive a signal (e.g., RESETB), an input 114 that may receive a signal (e.g., GRESETB), an output 116 that may present a signal (e.g., DOUT), and an output 118 that may present a signal (e.g., DOUTB). The signal XORIN may be, in one example, a data signal. The signal SCANIN may be, in one example, a scan test data signal. The signal CLK may be, in one example, a clock signal. The signals GINTSCNEN, RESETB, PRESETB, and GRESETB may be, in one example, control signals. The circuit 100 may be configured, in one example, to (i) select the signal XORIN or the signal SCANIN, (ii) register (e.g., store) the signal selected (e.g., XORIN or SCANIN), and (iii) propagate the signal selected as the signal DOUT in response to one or more of the signals CLK, GINTSCNEN, RESETB, GRESETB, and PRESETB. The circuit 100 may be configured, in one example, to select (i) the signal XORIN when the PLD is operating in a normal mode or (ii) the signal SCANIN when the PLD is operating in a test mode. The circuit 100 may be configured to asynchronously (i) deselect the signals XORIN and SCANIN and (ii) place the signal DOUT in a first logic state (e.g., HIGH, or a digital "1") or a second logic state (e.g., LOW, or a digital "0") in response to one or more of the signals RESETB, GRESETB, and PRESETB. The signal DOUTB may be the digital complement of the signal DOUT.

Figure 3:
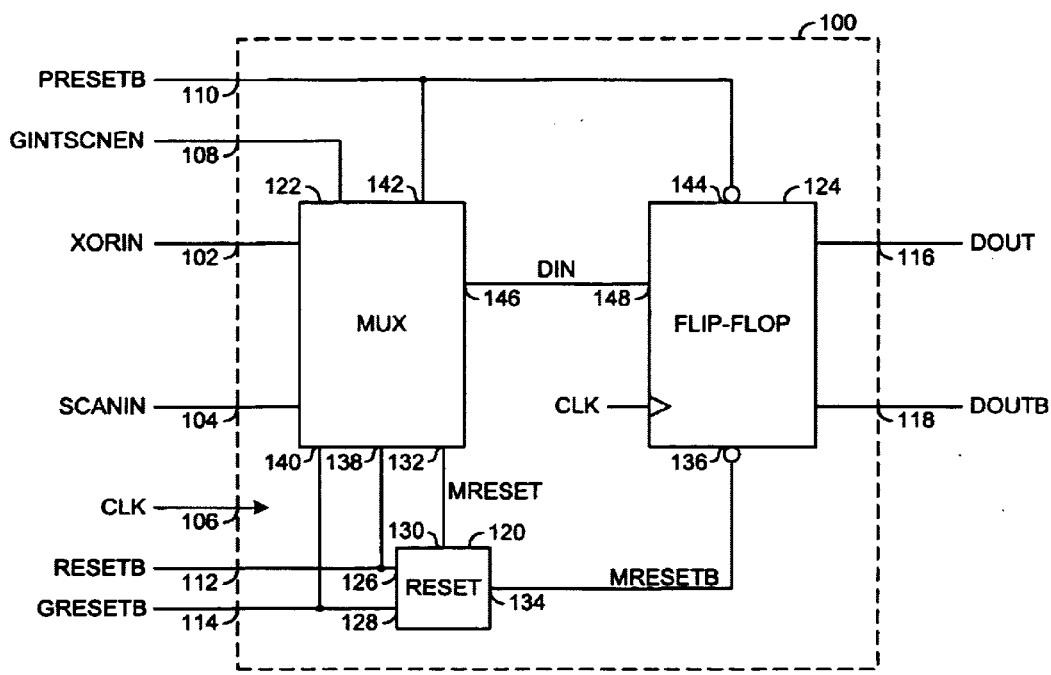
FIG. 3 is a detailed block diagram illustrating the preferred embodiment of a macro-cell flip-flop of FIG. 2.

Referring to FIG. 3, a detailed block diagram of the circuit 100 is shown. In one example, the circuit 100 may comprise a circuit 120, a circuit 122, and a circuit 124. The circuit 120 may be implemented, in one example, as a reset circuit. The circuit 122 may be implemented, in one example, as a multiplexer circuit. The circuit 124 may be implemented, in one example, as a D-type flip-flop circuit. However, other types of flip-flops may be implemented to meet the design criteria of a particular application. For example, the circuit 124 may be implemented as a configurable D/T/T-bar flip-flop or a latch. The circuit 120 may have an input 126 that may receive the signal RESETB, an input 128 that may receive the signal GRESETB, an output 130 that may present a signal (e.g., MRESET) to an input 132 of the circuit 122, and an output 134 that may present a signal MRESETB to an input 136 of the circuit 124. The circuit 120 may be configured to generate the signals MRESET and MRESETB in response to the signals RESETB and GRESETB. The signals MRESET and MRESETB may be digital complements.

The signals GINTSCNEN, XORIN, and SCANIN may be presented to the circuit 122: The circuit 122 may have an input 138 that may receive the signal RESETB, an input 140 that may receive the signal GRESETB, an input 142 that may receive the signal PRESETB, and an output 146 that may present a signal (e.g., DIN) to an input 148 of the circuit 124. The signal DIN may be used as an intermediate signal. The circuit 122 may be configured, in one example, to select the signal XORIN or the signal SCANIN as the signal DIN in response to one or more of the signals GINTSCNEN, PRESETB, RESETB, GRESETB, and MRESETB. The circuit 122 may be configured to asynchronously (i) deselect the signals XORIN and SCANIN and (ii) place the signal DIN in a first logic state (e.g., HIGH, or a digital "1") or a second logic state (e.g., LOW, or a digital "0") in response to one or more of the signals PRESETB, RESETB, GRESETB, and MRESETB.

The circuit 124 may have an input 144 that may receive the signal PRESETB and a clock input that may receive the signal CLK. The circuit 124 may be configured to present the signals DOUT and DOUTB in response to one or more of the signals PRESETB, DIN, CLK, and MRESETB.

Figure 4:
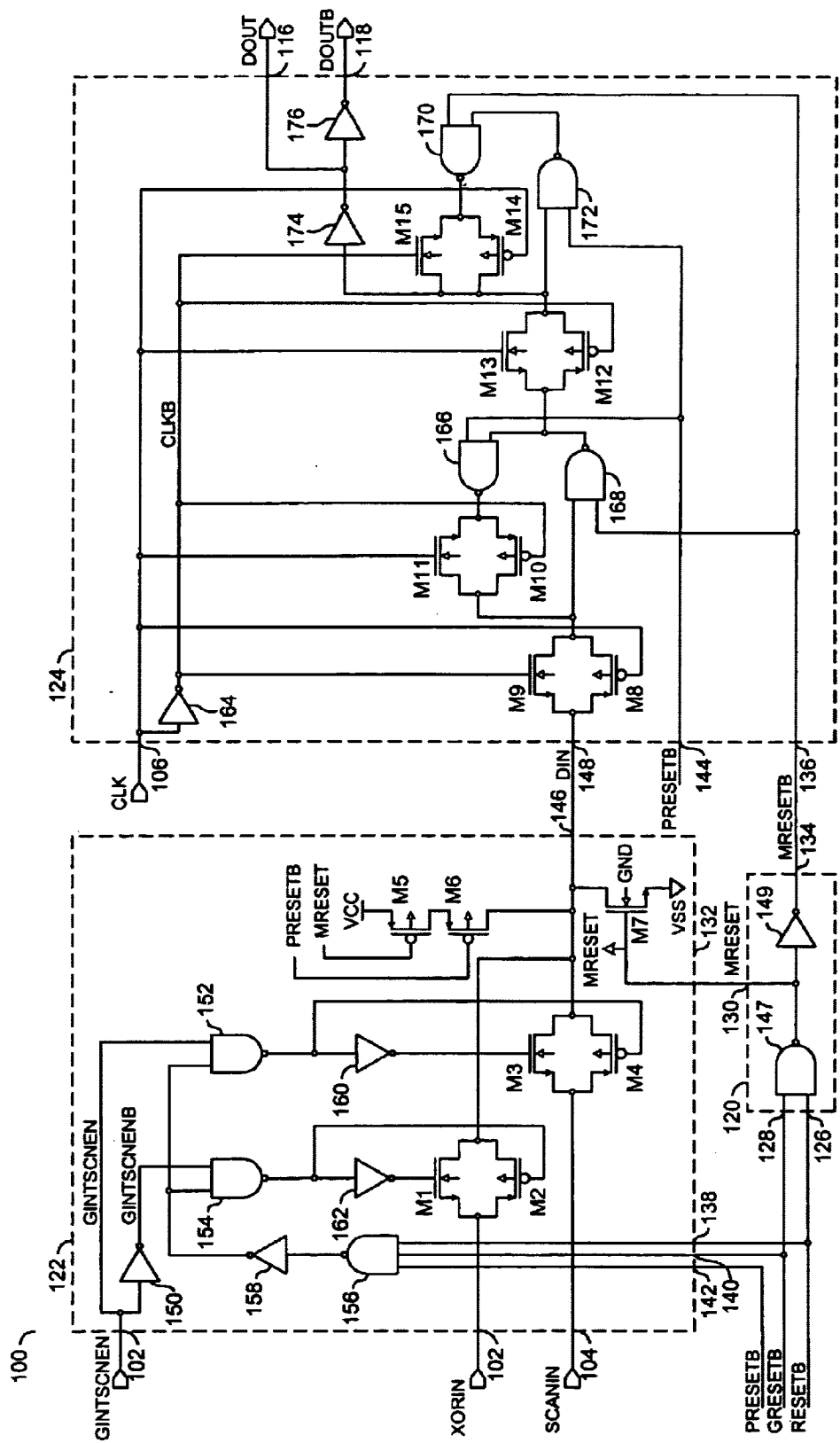
FIG. 4 is a schematic diagram of a preferred embodiment of a macro-cell flip-flop of FIG. 3.

The signals GRESETB, RESETB, and PRESETB may be used to asynchronously place the signals DIN, DOUT, and DOUTB at a first logic level (e.g., LOW) or a second logic level (e.g., HIGH). Example operations of the circuit 100 may be summarized in the following TABLE 1:

Referring to FIG. 4, a schematic diagram of the circuit 100 illustrating a preferred embodiment is shown. The circuit 120 may comprise a gate 147 and a gate 149. The gate 147 may be implemented, in one example, as a NAND gate. The gate 149 may be implemented, in one example, as an inverter. The gate 147 may have an input that may receive the signal RESETB, an input that may receive the signal GRESETB, and an output that may present the signal MRESET. The gate 149 may have an input that may receive the signal MRESET and an output that may present the signal MRESETB.

The circuit 122 may comprise a transistor M1, a transistor M2, a transistor M3, a transistor M4, a transistor M5, a transistor M6, a transistor M7, a gate 150, a gate 152, a gate 154, a gate 156, a gate 158, a gate 160, a gate 162. The transistors M1, M3, and M7 may be implemented as one or more NMOS transistors. The transistors M2, M4, M5, and M6 may be implemented as one or more PMOS transistors. However, other types and polarity transistors may be implemented accordingly to meet the design criteria of a particular application. The pair of transistors M1 and M2 and the pair of transistors M3 and M4 may be configured as CMOS switches. The gates 150, 158, 160, and 162 may be implemented, in one example, as inverters. The gates 152, 154, and 156 may be implemented, in one example, as NAND gates. However, other types of gates may be implemented to meet the design criteria of a particular application.

The signal GINTSCNEN may be presented to an input of the gate 150 and a first input of the gate 152. An output of the gate 150 may present a signal (e.g., GINTSCNENB) to a first input of the gate 154. The signals RESETB, PRESETB, and GRESETB may be presented to a first, a second, and a third input of the gate 156. An output of the gate 156 may present a signal to an input of the gate 158. An output of the gate 158 may present a signal to a second input of the gates 152 and 154. An output of the gate 152 may present a signal to an input of the gate 160 and a gate of the transistor M4. An output of the gate 160 may present a signal to a gate of the transistor M3. An output of the gate 154 may present a signal to an input of the gate 162 and a gate of the transistor M2. An output of the gate 162 may present a signal to a gate of the transistor M1.

The signal MRESET may be presented to a gate of the transistors M5 and M7. The signal PRESETB may be presented to a gate of the transistor M6. A source of the

TABLE 1

| GRESETB | PRESETB | RESETB | GINTSCNEN | DIN | DOUT |
|---------|---------|--------|-----------|-----|------|
| HIGH | LOW | HIGH | X | HIGH | HIGH |
| HIGH | HIGH | LOW | X | LOW | LOW |
| HIGH | LOW | LOW | X | LOW | LOW |
| HIGH | HIGH | HIGH | LOW | XORIN | XORIN |
| HIGH | HIGH | HIGH | HIGH | SCANIN | SCANIN |

The signal DOUT may be, in one example, a registered version of the signal XORIN or the signal SCANIN. The various signals are generally "on" (e.g., a digital HIGH, or 1) or "off" (e.g., a digital LOW or 0). The value "X" generally indicates a condition wherein the state of the signal is irrelevant or a "don't care" condition. However, the particular polarities of the on (e.g., asserted) and off (e.g., de-asserted) states of the signals may be adjusted (e.g., reversed) accordingly to meet the design criteria of a particular implementation.

transistor M5 may be connected to a supply voltage (e.g., VCC). A drain of the transistor M5 may be connected to a source of the transistor M6. A source of the transistor M7 may be connected to a ground voltage (e.g., VSS). The signal XORIN may be presented to a first source/drain of the transistors M1 and M2. The signal SCANIN may be presented to a first source/drain of the transistors M3 and M4. A second source/drain of the transistors M1, M2, M3, and M4, and a drain of the transistors M6 and M7 may be connected to the output 146. The signal DIN may be presented at the output 146.

The circuit 124 may comprise a transistor M8, a transistor M9, a transistor M10, a transistor M11, a transistor M12, a transistor M13, a transistor M14, a transistor M15, a gate 164, a gate 166, a gate 168, a gate 170, a gate 172, a gate 174, and a gate 176. The transistors M9, M11, M13, and M15 may be implemented as one or more NMOS transistors. The transistors M8, M10, M12, and M14 may be implemented as one or more PMOS transistors. However, other types and polarity transistors may be implemented accordingly to meet the design criteria of a particular application.

The pairs of transistors M8–M9, M10–M11, M12–M13, and M14–M15 may be configured as CMOS switches. The gates 164, 174, and 176 may be implemented, in one example, as inverters. The gates 166, 168, 170, and 172 may be implemented, in one example, as NAND gates. However, other types of gates may be implemented to meet the design criteria of a particular application.

The signal CLK may be presented to an input of the gate 164 and a gate of the transistors M8, M11, M13, and M14. The gate 164 may have an output that may present a signal (e.g., CLKB) to a gate of the transistors M9, M10, M12, and M15. The signal DIN may be presented to a first source/drain of the transistors M8 and M9. A second source/drain of the transistors M8 and M9 may be connected to (i) an input of the gate 168 and (ii) a first source/drain of the transistors M10 and M11. An output of the gate 168 may present a signal to a first input of the gate 166 and a first source/drain of the transistors M12 and M13. A second source/drain of the transistors M12 and M13 may present a signal to (i) a first source/drain of the transistors M14 and M15, (ii) a first input of the gate 172, and (iii) an input of the gate 174.

The signal PRESETB may be presented to a second input of the gates 166 and 172. An output of the gate 166 may present a signal to a second source/drain of the transistors M10 and M11. An output of the gate 172 may present a signal to a first input of the gate 170. The signal MRESETB may be presented to a second input of the gates 168 and 170. An output of the gate 170 may present a signal to a second source/drain of the transistors M14 and M15. The gate 174 may have an output that may present the signal DOUT to the output 116 of the circuit 124 and an input of the gate 176. The gate 176 may have an output that may present the signal DOUTB.

In one example, the interconnection of the transistors M8–M11, the gate 166, and the gate 168 may comprise a master flip flop. The interconnection of the transistors M12, M13, M14, M15, the gate 170, and the gate 172 may comprise a slave flip flop.

The circuit 100 may be asynchronously reset or preset in response to the signals RESETB, GRESETB, and PRESETB. In one example, the reset operation may have priority. When the circuit 100 is reset or preset, the signals XORIN and SCANIN are generally deselected. When the signals XORIN and SCANIN are deselected, the signal DIN may be prevented from floating by the transistors M5–M7. In one example, the transistors M5–M7 may be configured to pull the signal DIN (and the input 148) HIGH in response to the signal PRESETB or LOW in response to one or more of the signals RESETB and GRESETB. However, other signal polarities may be implemented to meet the design criteria of a particular application. In one example, signal levels of the circuit 100 during asynchronous reset and preset operations may be summarized in the following TABLE 2:

TABLE 2

| CONDITION | GRESETB | PRESETB | RESETB | GINTSCNEN | DIN | DOUT |
|---|---|---|---|---|---|---|
| PRESET | HIGH | LOW | HIGH | X | HIGH | HIGH |
| RESET | HIGH | HIGH | LOW | X | LOW | LOW |
| RESET | HIGH | LOW | LOW | X | LOW | LOW |
| RESET | LOW | X | X | X | LOW | LOW |

During an asynchronous reset or an asynchronous preset operation of the circuit 100, the signals DIN and DOUT may be placed in a first logic state (e.g., LOW) or a second logic state (e.g., HIGH), respectively. Placing the signal DIN in the first or second logic state may prevent the input 148 of the circuit 124 from floating when the signals XORIN and SCANIN are deselected. The signal DOUT may be placed in the first or second logic state in response to the signal DIN or the signals PRESETB and MRESETB through a signal path generally determined by a logic level of the signal CLK as summarized in the following TABLE 3:

TABLE 3

| CONDITION | DIN | DOUT | CLK | SIGNAL PATH |
|---|---|---|---|---|
| RESET | LOW | LOW | LOW | gate 170, to transistors M14 and M15, to gate 174 |
| RESET | LOW | LOW | HIGH | gate 168, to transistors M12 and M13 to gate 174 |
| PRESET | HIGH | HIGH | LOW | gate 172, to gate 170, to transistors M14 and M15, to gate 174 |
| PRESET | HIGH | HIGH | HIGH | gate 166, to transistors M10 and M11, to gate 168, to transistors M12 and M13, to gate 174 |

Figure 5:
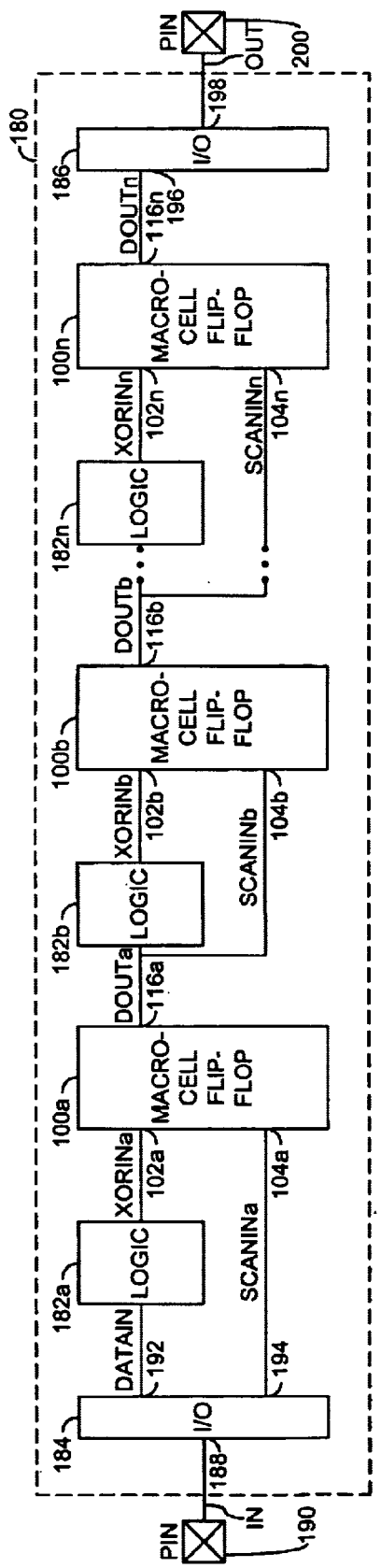
FIG. 5 is a block diagram illustrating a scan chain implemented in accordance with the present invention.

Referring to FIG. 5, a block diagram of a programmable logic device in accordance with the present invention is shown. A programmable logic device (PLD) 180 implemented in accordance with the present invention may comprise a number of macro-cells 100a–100n, a number of programmable logic circuits 182a–182n, an I/O circuit 184, and an I/O circuit 186. The circuits 100a–100n may have inputs 102a–102n and 104a–104n and outputs 116a–116n, respectively. The circuit 184 may have an input 188 that may receive a signal (e.g., IN) from an external pin 190, an output 192 that may present a signal (e.g., DATAIN) to the programmable logic circuit 182a, and an output 194 that may present a signal (e.g., SCANINa) to the input 104a of the circuit 100a. The programmable logic circuit 182a may present a signal (e.g., XORINa) to the input 102a of the circuit 100a. The circuit 100a may present a signal (e.g., DOUTa) to the programmable logic circuit 182b. The signal DOUTa may be, in one example, presented to the input 104b of the circuit 100b as a test signal (e.g., SCANINb). A scan chain may be easily formed by similarly connecting the macro-cell flip-flops 100c–100n. A test signal presented to the I/O pin 190 may be propagated through the scan chain as the signals SCANINa–SCANINn. The circuit 100n may present a signal (e.g., DOUTn) to an input 196 of the I/O circuit 186. The I/O circuit 186 may have an output 198 that may present a signal (e.g., OUT) to an external pin 200.

In one example, the macro-cell flip-flops 100a–100n may be operated in a test mode by performing the following steps: A) programming the macro-cell flip-flops 100a–100n to select the inputs 104a–104n; B) presenting a test signal to the pin 190, and C) after n clock cycles where n is an integer, detecting whether the test signal is presented at the pin 200. When not in the test mode, the circuits 100a–100n may be programmed to select the inputs 102a–102n.

The present invention may provide a macro-cell flip-flop with a scan-in input that may (i) provide an easily accessible internal scan test interface, (ii) improve testability of the macro-cells and surrounding logic inside a PLD, (iii) eliminate the requirement for a one-to-one correspondence between I/O pins and macro-cells, (iv) be configured as a part of regular logic or a test scan chain, (v) easily form a test scan chain, containing all the macro-cells of a PLD, (vi) not require additional registers for the scan operation, and/or (vii) be asynchronously reset or preset.

While the invention has been particularly shown and described with reference to the preferred embodiments thereof, it will be understood by those skilled in the art that various changes in form and details may be made without departing from the spirit and scope of the invention.

What is claimed is:

1. A programmable logic device having a macro-cell comprising:

a multiplexer circuit configured to present (i) a first input as an output in response to a first state of a first control signal and (ii) a second as said output in response a second state of said first control signal; and a flip-flop circuit configured to store said output in response to a clock signal.

2. The programmable logic device according to claim 1, wherein said second input is received from an output of a second macro-cell flip-flop circuit.

3. The programmable logic device according to claim 1, wherein said first input comprises a data signal.

4. The programmable logic device according to claim 3, wherein said data signal comprises a sum-of-products term.

5. The programmable logic device according to claim 1, wherein said first input is generated in a programmable logic circuit.

6. The programmable logic device according to claim 1, wherein said second input comprises a test signal.

7. The programmable logic device according to claim 6, wherein said test signal is a JTAG boundary scan test signal.

8. The programmable logic device according to claim 1, wherein said macro-cell further comprises a reset circuit configured to present one or more second control signals to said multiplexer circuit and said flip-flop circuit.

9. The programmable logic device according to claim 1, wherein said multiplexer circuit comprises a plurality of CMOS switches controlled in response to said first control signal.

10. The programmable logic device according to claim 1, wherein said flip-flop circuit comprises a D-type flip-flop circuit.

11. The programmable logic device according to claim 1, wherein said flip-flop circuit comprises a configurable D/T/T-bar flip-flop circuit.

12. The programmable logic device according to claim 1, wherein said macro-cell changes between a test mode and a normal mode in response to said first control signal.

13. The programmable logic device according to claim 1, wherein said macro-cell is asynchronously reset or preset in response to one or more second control signals.

14. The programmable logic device according to claim 13 wherein:

said multiplexer circuit is configured to (i) deselect said first input and said second input and (ii) present said output having a first or a second logic state in response to said one or more second control signals.

15. The programmable logic device according to claim 13, wherein said one or more second control signals comprise reset signals.

16. The programmable logic device according to claim 13, wherein said one or more second control signals comprise a preset signal.

17. The programmable logic device according to claim 1, wherein two or more of said macro-cells are connected in a serial chain.

18. The programmable logic device according to claim 17, wherein said serial chain comprises a scan chain.

19. A programmable logic device comprising:

a first macro-cell flip-flop configured to generate a first output signal in response to a first input signal, a second input signal, a first control signal and a first clock signal, wherein said first macro-cell flip-flop stores (i) a state of said first input signal in response to said first clock signal and a first state of said first control signal and (ii) a state of said second input signal in response to said first clock signal and a second state of said first control signal; and a second macro-cell flip-flop configured to generate a second output signal in response to (i) said first output signal (ii) a third input signal, said first control signal and a second clock signal, wherein said second macro-cell flip-flop stores (i) a state of said first output signal in response to said second clock signal and said first state of said first control signal and (ii) a state of said third input signal in response to said second clock signal and said second state of said first control signal.

20. A method for forming a scan chain containing a number of macro-cell flip-flops of a programmable logic device comprising the steps of:

(A) generating a first control signal having a first state during a test mode and a second state during a normal mode of said programmable logic device;

(B) during said test mode, (i) deselecting a first input to each of said number of macro-cell flip-flops and (ii) selecting a second input to each of said number of macro-cell flip-flops in response to said first state of said first control signal, wherein an output of a first of said number of macro-cell flip-flops is coupled to said second input of a second of said number of macro-cell flip-flops; and (C) during said normal mode, (i) selecting said first input to each of said number of macro-cell flip-flops and (ii) deselecting said second input to each of said number of macro-cell flip-flops in response to said second state of said first control signal, wherein said first input of said number of macro-cell flip-flops is connected to programmable logic of said programmable logic device.

21. The method according to claim 20, further comprising the step of:

(D) asynchronously resetting or presetting said macro-cell flip-flops in response to one or more second control signals.

22. The method according to claim 20, wherein said first input of said macro-cells is configured to receive a data signal comprising a sum-of-products term.

23. The method according to claim 20, wherein said test mode comprises a boundary scan test mode.

* * * * *